(12) United States Patent
Servaes

(10) Patent No.: US 8,958,468 B2
(45) Date of Patent: Feb. 17, 2015

(54) SYSTEM AND METHOD FOR CANCELING RADIO FREQUENCY INTERFERERS (RFI'S) IN XDSL SIGNALS

(75) Inventor: Christophe Servaes, Guttenberg, NJ (US)

(73) Assignee: Ikanos Communications, Inc., Fremont, CA (US)

( * ) Notice: Subject to any disclaimer, the term of this patent is extended or adjusted under 35 U.S.C. 154(b) by 1505 days.

(21) Appl. No.: 10/952,435

(22) Filed: Sep. 29, 2004

(65) Prior Publication Data

US 2005/0152467 A1 Jul. 14, 2005

Related U.S. Application Data

(60) Provisional application No. 60/506,173, filed on Sep. 29, 2003.

(51) Int. Cl.
| | |
|---|---|
| H03K 5/159 | (2006.01) |
| H04B 1/10 | (2006.01) |
| H01L 21/28 | (2006.01) |
| H01L 21/314 | (2006.01) |
| H01L 29/51 | (2006.01) |
| H04L 25/03 | (2006.01) |
| H01L 21/324 | (2006.01) |

(52) U.S. Cl.
CPC .... *H01L 21/28185* (2013.01); *H01L 21/28061* (2013.01); *H01L 21/28202* (2013.01); *H01L 21/28211* (2013.01); *H01L 21/3143* (2013.01); *H01L 29/513* (2013.01); *H01L 29/518* (2013.01); *H04L 25/03159* (2013.01); *H01L 21/28247* (2013.01); *H01L 21/324* (2013.01); *H04L 2025/03414* (2013.01); *H04L 2025/03496* (2013.01); *H04L 2025/03522* (2013.01)
USPC ............ 375/229; 375/350; 375/346; 375/232

(58) Field of Classification Search
USPC ............... 375/229–236, 240.26–240.29, 285, 375/295, 296, 316, 346, 348, 350, 219, 284, 375/340, 343, 347, 324
See application file for complete search history.

(56) References Cited

U.S. PATENT DOCUMENTS

| | | | | |
|---|---|---|---|---|
| 6,608,864 | B1 * | 8/2003 | Strait | 375/233 |
| 7,020,212 | B1 * | 3/2006 | Strait | 375/260 |
| 2002/0094043 | A1 * | 7/2002 | Chu et al. | 375/346 |

* cited by examiner

*Primary Examiner* — Sam K Ahn
*Assistant Examiner* — Linda Wong
(74) *Attorney, Agent, or Firm* — Pillsbury Winthrop Shaw Pittman LLP

(57) ABSTRACT

A system and method for canceling noise in a received signal are provided. A signal is received at a receiver comprising a frequency domain equalizer (FEQ). A noise prediction error of the signal is determined. The FEQ is updated with the noise prediction error, wherein the act of updating mitigates the effect of noise in the signal.

20 Claims, 9 Drawing Sheets

SYSTEM AND METHOD FOR CANCELING RADIO FREQUENCY INTERFERERS (RFI'S) IN XDSL SIGNALS

RELATED APPLICATION

This application claims priority to U.S. Application No. 60/506,173 filed Sep. 29, 2003, which is incorporated by reference herein in its entirety.

FIELD OF THE INVENTION

The present invention relates generally to the field of telecommunications. More particularly, the present invention relates to canceling noise in data communications received at a receiver.

BACKGROUND OF THE INVENTION

The explosive growth of the Internet has created a demand for high data rates for home users that rely on standard analog "plain old telephone systems" (POTS) that use a copper wire twisted pair to carry the information. The need for high-speed access to the home is inevitable due to the availability of information, data, high-bandwidth video and the like from the world wide web, and because of such demand, higher speed modems are required. Modems operating at rates exceeding 33,600 bits/second are in use nowadays.

Digital subscriber lines (DSL) such as Very High-speed Digital Subscriber Line (VDSL), Asymmetric Digital Subscriber Line (ADSL), ADSL-plus, and other xDSL systems are modern ways of using a telephone network for high-speed digital communication. One of the problems with these and similar technologies is that the frequency range used for ADSL, ADSL-plus and VDSL signaling is shared with radio amateurs and broadcast AM radio. A transmitter in the proximity of a wire will induce an electric signal in the wire. This is called Radio Frequency Interference (RFI). In receiving VDSL communications, moderate levels of RFI may be handled in the digital domain by various cancellation techniques. However, if the RFI level is greater than what the ADSL, ADSL-plus or the VDSL receiver is designed for, clipping of the received signal may occur. Such clipping may be caused and/or created by components in the receiver itself, such as amplifiers and Analog to Digital Converters (ADCs).

SUMMARY OF THE INVENTION

Accordingly, various embodiments of the present inventions may be directed to a system and a method for canceling noise in a received signal. A signal is received at a receiver comprising a frequency domain equalizer (FEQ). A noise prediction error of the signal is determined. The FEQ is updated with the noise prediction error, wherein the act of updating mitigates the effect of noise in the signal.

According to another embodiment of the invention, a system for canceling noise in a received signal is provided. A receiver receives a signal at a receiver comprising a frequency domain equalizer (FEQ). A processor determines a noise prediction error of the signal. A signal combiner updates the FEQ with the noise prediction error, wherein the act of updating mitigates the effect of noise in the signal.

According to another embodiment of the invention, a system for canceling noise in a received signal is provided. The system comprises means for receiving a signal at a receiver comprising a frequency domain equalizer (FEQ). The system comprises means for determining a noise prediction error of the signal. The system further comprises means for updating the FEQ with the noise prediction error, wherein the act of updating mitigates the effect of noise in the signal.

BRIEF DESCRIPTION OF THE DRAWINGS

The present invention can be understood more completely by reading the following Detailed Description of the Preferred Embodiments, in conjunction with the accompanying drawings and tables.

DETAILED DESCRIPTION OF THE INVENTION

This invention relates to systems and methods for reducing or eliminating noise in communication signals, e.g., signals traveling in xDSL signals such as high-bandwidth ADSL, ADSL-plus and VDSL schemes. The noise may be caused by the transmission of nearby narrowband signals such as amplitude-modulated (AM) and frequency-modulated (FM) signals that are proximate to the xDSL signals. Other xDSL systems are contemplated herein for use with the invention, such as High Bit Rate DSL, Moderate Speed DSL, Rate Adaptive DSL, Symmetric DSL, and Very High Data Rate DSL.

For instance, the invention may be used in receivers receiving data over telephone networks. In some embodiments, a method for improving noise immunity against radio frequency signals emanating from nearby AM transmitters is provided.

Figure 1:
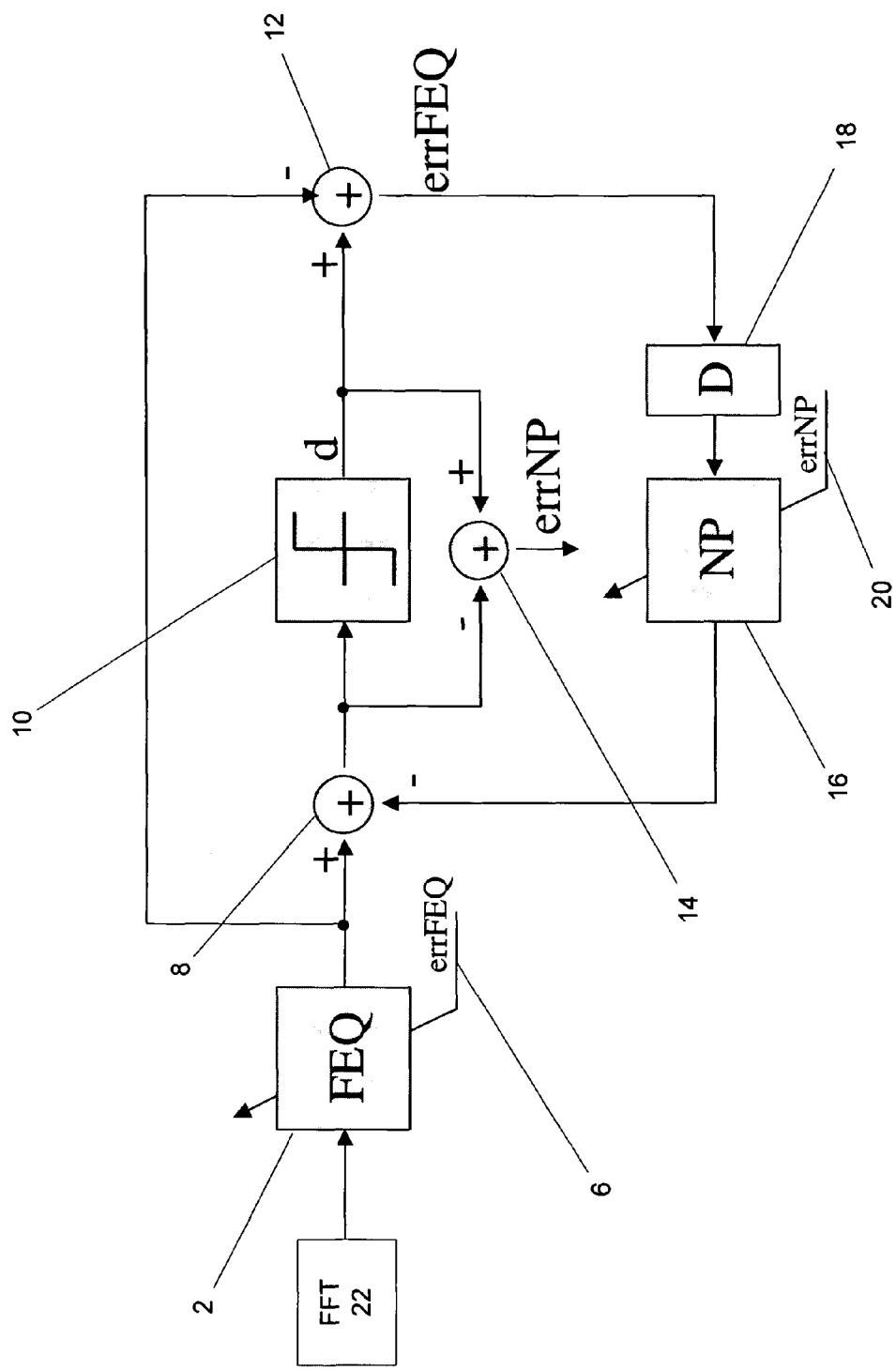
FIG. 1 depicts a noise predictor.

FIG. 1 depicts a noise predictor circuit diagram. The noise predictor circuit may be part of a receiver, and it may attempt to minimize errors caused by noise, such as noise from radio frequency interferers (RFIs). The noise predictor may comprise the following: Fast Fourier Transform (FFT) 22, or other receiver element, with output FFTout; frequency-domain equalizer (FEQ) 2; comparers 8, 12, 14 (e.g., summers, or other devices which may add, subtract, or otherwise compare inputs); data slicer 10; delay 18, which may be configured to delay a signal (e.g., for a predetermined time interval, such as until the next symbol or corresponding tone for a multi-tone signal); and noise predictor (NP) 16, which may be updated and/or corrected by noise predictor error (errNP) as shown in 20.

FFout may comprise the complex FFT output at tone m; FEQ may comprise a complex single tap FEQ 2 at tone m; NP 16 may comprise a complex single tap noise predictor at tone m; d may comprise the decision at tone m; errFEQ may comprise the error at the FEQ (e.g., the FEQ error); errNP may comprise the error at the noise predictor; and D may comprise a delay 18 of one symbol (e.g., a set of tones at a given time).

As shown in element 6 of FIG. 1, the FEQ 2 may be updated with errFEQ.

Figure 2:
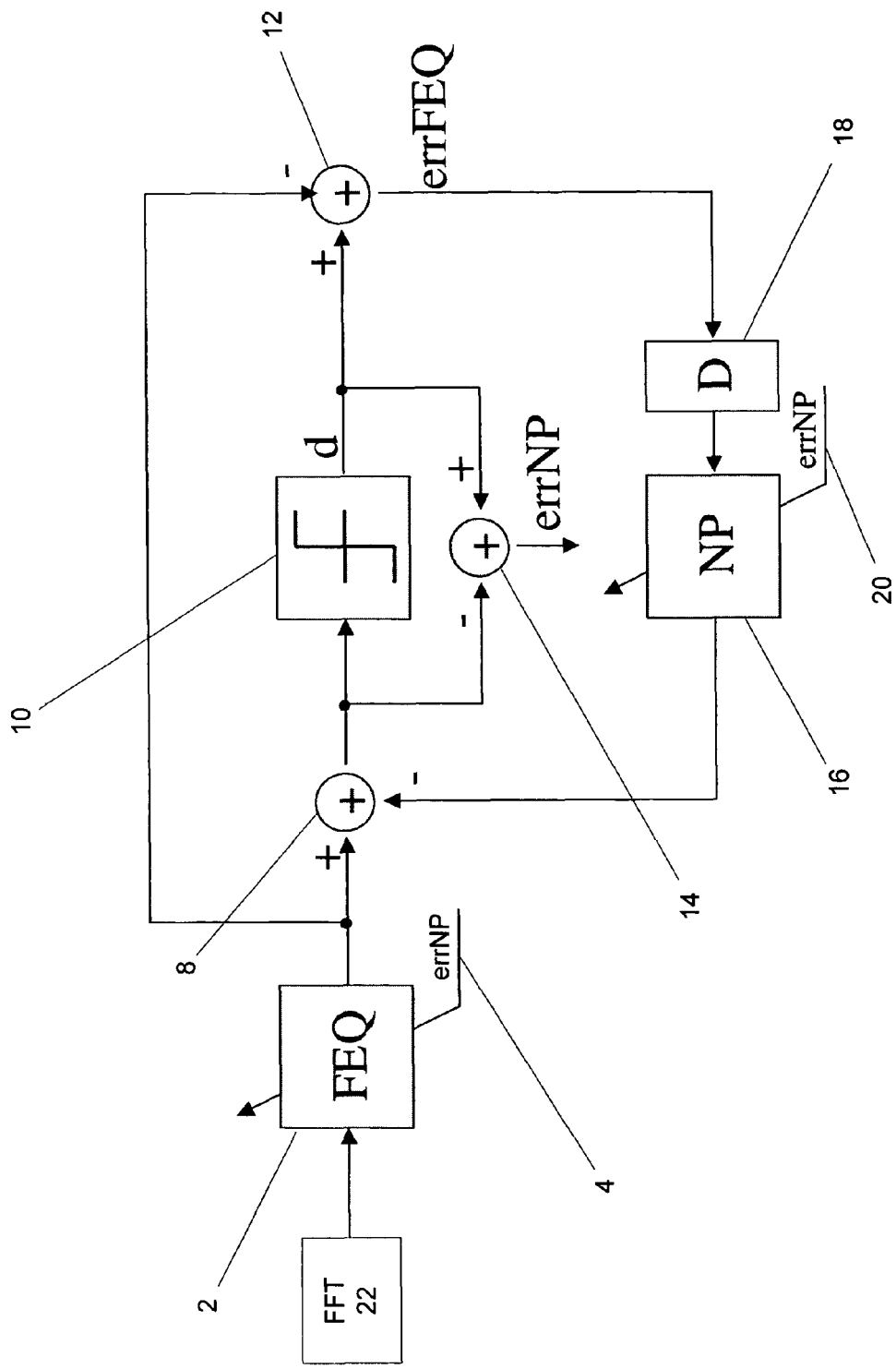
FIG. 2 depicts an implementation of a noise predictor according to an embodiment of the present invention.

FIG. 2 depicts an implementation of a noise predictor according to an embodiment of the present invention. The implementation of FIG. 2 differs from that of FIG. 1 in that the FEQ may be updated and/or corrected with noise predictor error (errNP) instead of errFEQ. In some embodiments of the invention, the FEQ may be updated with the errNP and not with errFEQ. (In other embodiments (not shown in FIG. 2), the FEQ may be updated with only one of these elements, and/or with a combination (e.g., a weighted sum) of both errNP and errFEQ.)

Figure 3:
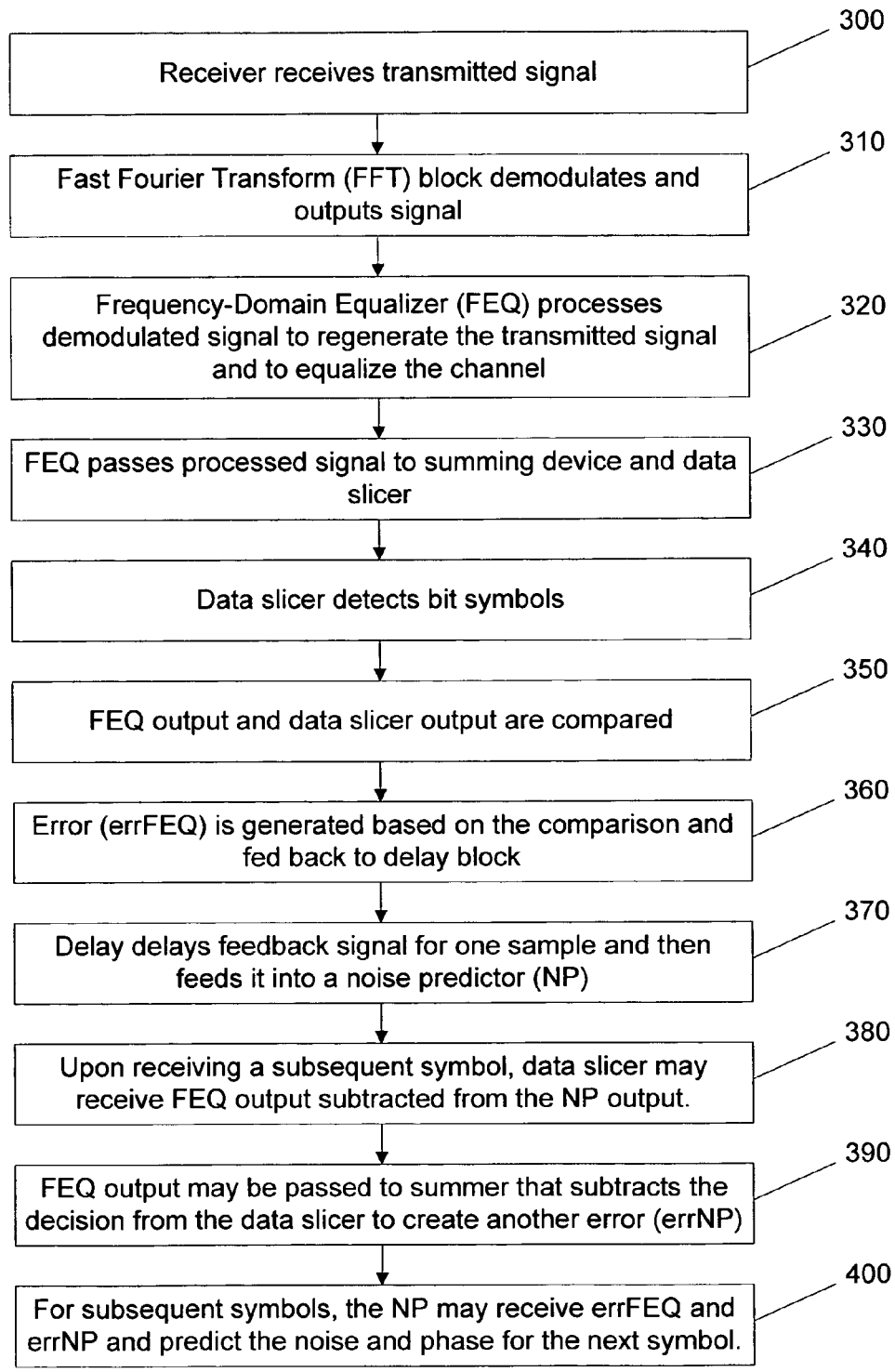
FIG. 3 depicts a flow chart for predicting noise according to the implementation shown in FIG. 2 according to an embodiment of the invention.

FIG. 3 depicts a flow chart for predicting noise according to the implementation shown in FIG. 2 according to an embodiment of the invention.

In block 300, a signal is passed to a receiver. The signal may be a modulated, discrete, and/or multi-tone signal (e.g., a discrete multi-tone signal), and it may be passed by an xDSL system or other transceiver system. Interference such as RFI may be present, which may cause noise in the signal.

In block 310, a demodulator 22 or other processor (e.g., an FFT block 22) may demodulate and output the signal as FFTout.

In block 320, the demodulated signal output from the demodulator 22 (e.g., FFTout) may be passed through an FEQ 2, e.g., to regenerate the transmitted signal and to equalize the channel. As used herein, the channel may comprise one or more transmission wires for hard-wired communication or one or more frequencies or frequency bands for wireless communication.

In block 330, the output of the FEQ 2 is sent simultaneously to a summing device 12 and to a data slicer 10.

In block 340, the data slicer 10 detects bit symbols of the signal.

In block 350, the outputs of the FEQ 2 and the data slicer 10 are compared by a summer/comparer 12. For instance, the FEQ 2 output may be subtracted from the data slicer 10 output by a summer.

In block 360, an error (e.g., errFEQ) may be generated based on the comparison. The error may be fed back to the delay 18.

In block 370, the delay block 18 may delay the error signal for one sample. The delay 18 may then pass the error to a noise predictor (NP), e.g., a single-tap NP.

In block 380, upon receiving the subsequent symbol, the data slicer may receive an input comprising the NP output subtracted from the FEQ output.

In block 390, data slicer input may also be passed onto a summer that subtracts the data slicer output (e.g., the decision) from the data slicer input to create (or determine) another error (e.g., errNP).

In block 400, errNP may be fed back to the FEQ. The errNP may be used to update the FEQ coefficient.

In block 410, on subsequent symbols, the NP may receive errFEQ and errNP, and may predict (e.g., calculates or sums) what the next noise amplitude and phase will be.

It should be appreciated that the actions described in the above blocks of FIG. 3 may be accomplished in any order. Some or all may be accomplished in accordance with some embodiments of the invention.

In this scheme, all tones may be independent from each other. (Hence, the elimination of the tone number, m, can be accomplished on the following signals.)

Returning to elements of the system of FIG. 1A, at a given symbol, k, the equalization process may be governed by the following equations:

$$\text{Equalizer}_k = \text{FFTout}_k \bullet \text{FEQ}_k - \text{NP}_k \bullet \text{errFEQ}_{k-1} \quad \text{[Equation 1]}$$

where • is a complex multiplication. The update of the FEQ and NP may be accomplished trough the LMS algorithm:

$$\text{FEQ}_{k+1} = \text{FEQk} + \mu_{FEQ} \cdot \text{errFEQ}_k \bullet \text{FFTout}_k^* \quad \text{[Equation 2]}$$

$$\text{NP}_{k+1} = \text{NP}_k - \mu_{NP} \cdot \text{errNP}_k \bullet \text{errFEQ}_{k-1}^* \quad \text{[Equation 3]}$$

where * denotes the complex conjugate.

In this scheme, the FEQ may be totally independent of the NP since the FEQ may be still trained with its own error. When a radio frequency interference (RFI) is present, the FEQ update may constantly be affected by the interferer, making it jittery in some cases. To avoid this jitter, the FEQ may be updated (at least in part) with the Noise Predictor (NP) error (errNP) since this error may be free (or substantially free) of interferer interference. The following modified equation may be used:

$$\text{FEQ}_{k+1} = \text{FEQk} + \mu_{FEQ} \cdot \text{errNP}_k \bullet \text{FFTout}_k^* \quad \text{[Equation 4]}$$

It should be noted that when there is no RFI, the NP error may be equivalent to the FEQ error.

It should also be noted that in addition to the FEQ coefficients (e.g., 512 coefficients for 512 tones), the receiver may also need to have and/or store (e.g., in RAM or a buffer) noise predictor coefficients (e.g., 512 coefficients for 512 tones) and noise predictor error coefficients (e.g., 512 coefficients for 512 tones).

A noise predictor algorithm according to an embodiment of the invention has been simulated in matlab. In this matlab simulation the FEQ coefficients are ideal: there are fixed values, and no update on them has been performed. This presents good conditions under which to test a noise predictor according to an embodiment of the invention. Little or no jitter on the FEQ is introduce by the RFI, and there is infinite floating point resolution on the signals. The sole limitation is the slicer that takes a hard decision based on the received signal.

The RFI has been modeled as:

$$rfi = (1 + a(t)) \cdot \sin\left(2 \cdot \pi \cdot \frac{f_c}{f_s} \cdot t + \varphi_0\right) \quad \text{[Equation 5]}$$

with a(t)=0, fc=276.517 kHz, fs=4416 kHz and φ0=0.

In this example, the received signal (Rx) was normalized to 0 dB; the additive white gaussian noise was set to −50 dB; and the RFI was set to 0 dB.

Figure 4:
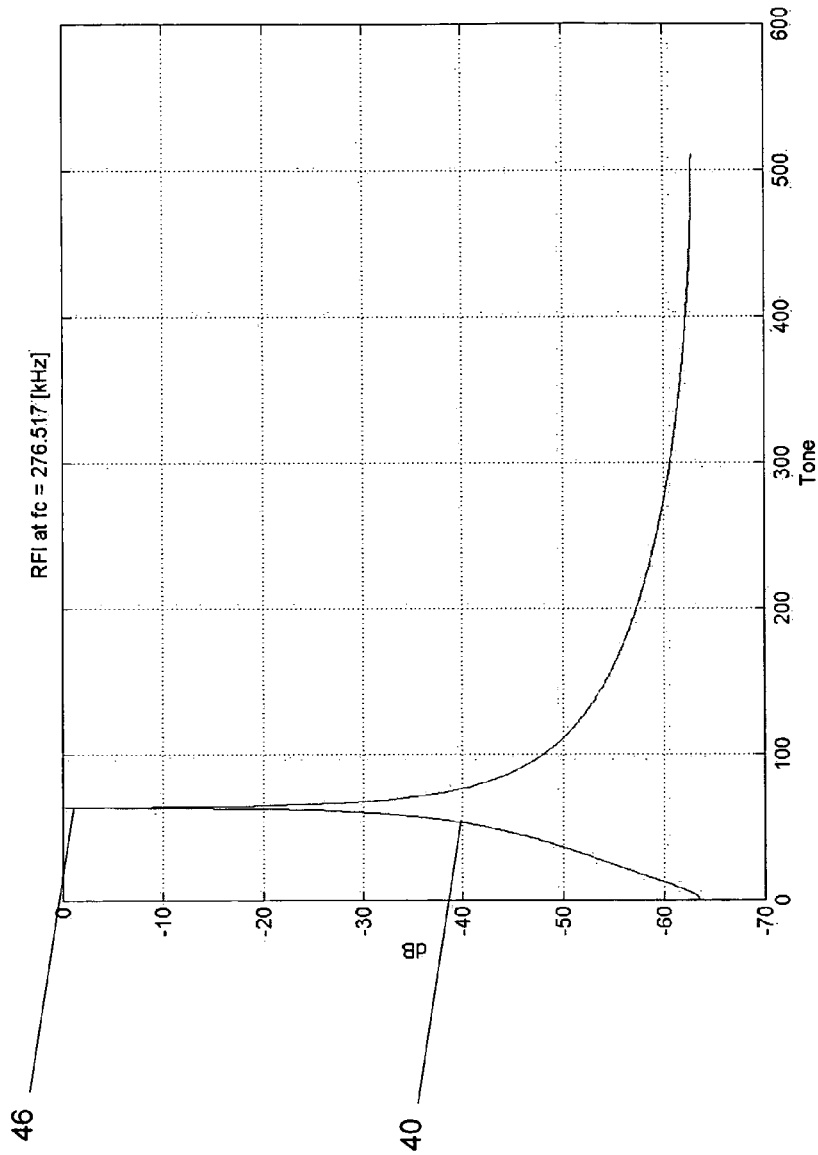
FIG. 4 depicts radio frequency interference tone spread over a number of DMT tones according to a computer simulation.

FIG. 4 depicts radio frequency interference tone spread over a number of DMT tones. The RFI tone is depicted at FIG. 2 and spread on many tones since it is not exactly centered on a DMT tone (i.e., an integer multiple of 4.3125 kHz). This RFI adds itself on the Rx as a rotating offset with a constant amplitude (a(t)=0).

Figure 5:
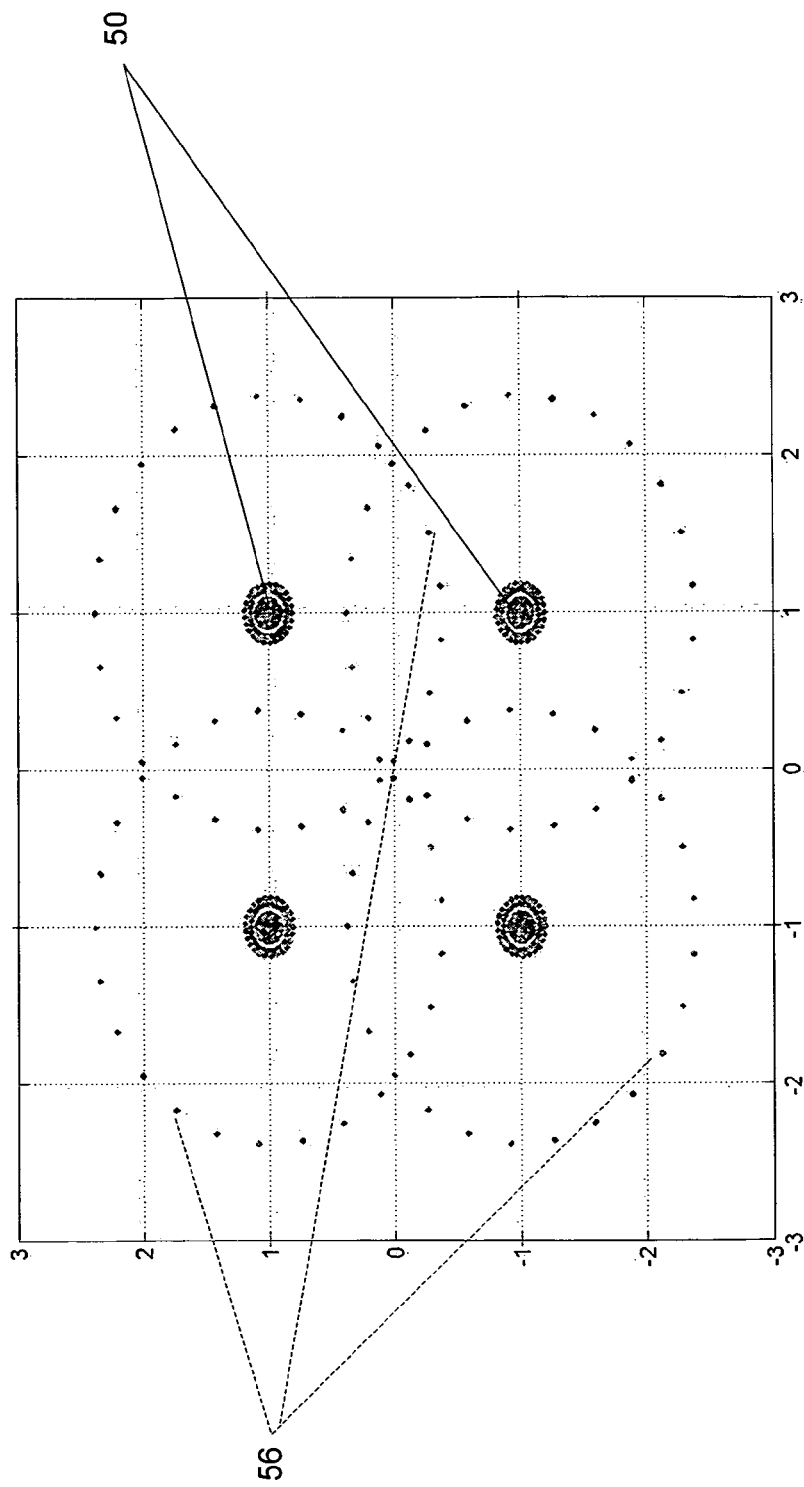
FIG. 5 is a slicer output showing the constellation and the RFI in a QAM modulation.

FIG. 5 depicts a slicer output showing the constellation and the RFI in a QAM modulation. The impact of this RFI is depicted at FIG. 5, which shows the superposition of the received signals consisting of only 32 consecutives bins containing the RFI, each loaded with only two bits per bin.

Example 1

Figure 6:
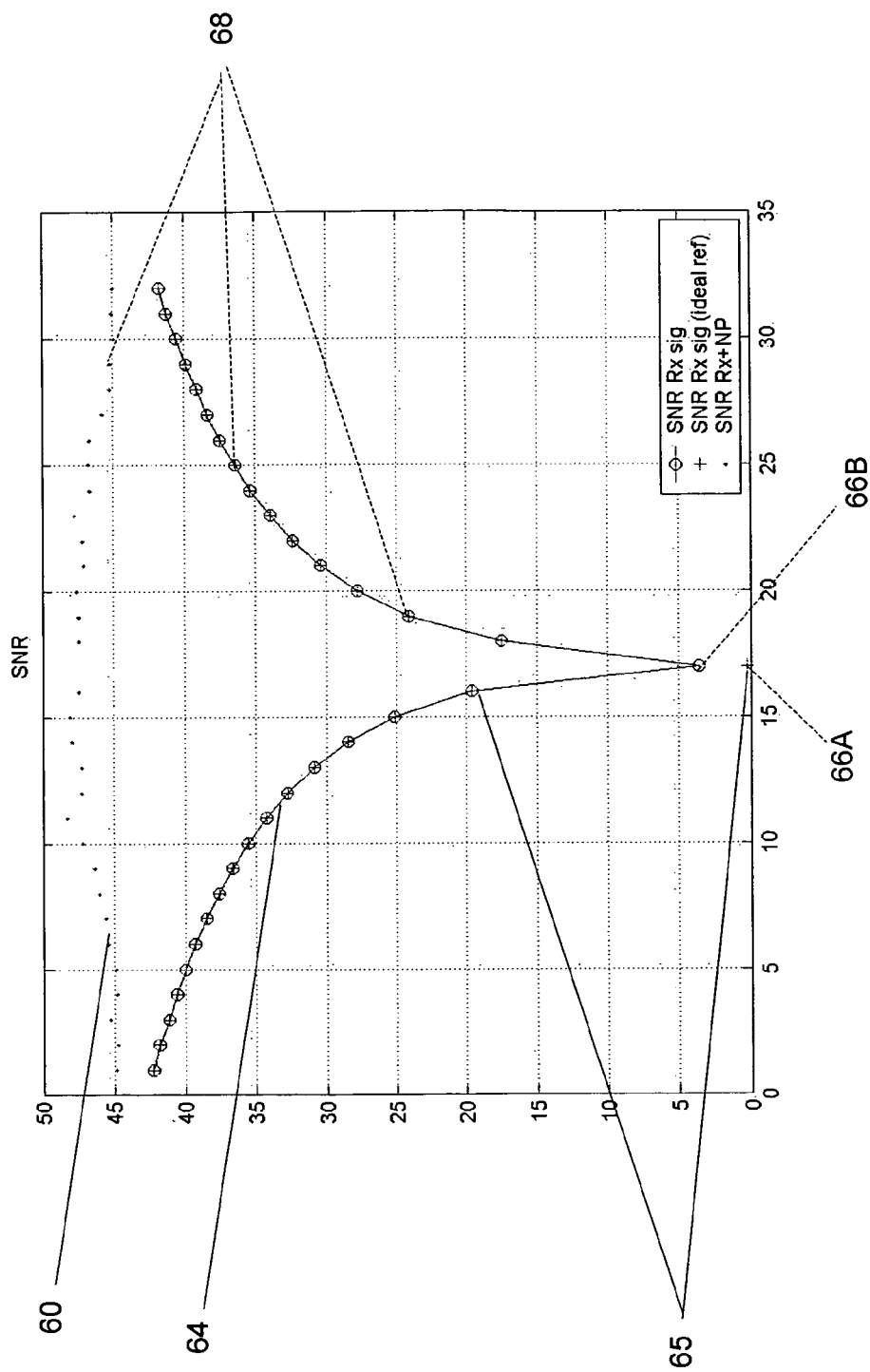
FIG. 6 depicts a signal-to-noise ratio comparison without a noise predictor and with a noise predictor according to an embodiment of the invention.

In FIG. 6, SNR Rx with ideal reference (SNR plot 65, also shown largely by the SNR plot 64, see legend on the graph itself) is the SNR of the received signal using the ideal reference. SNR Rx (plot 64) is the SNR of the received signal based on the slicer error. SNR Rx+NP (plot 60) is the SNR of the received signal with the noise predictor.

For both plots 65 and 65, the SNR is plotted for a plurality of tones 68. As shown in FIG. 6 at points 66A and 66B, the curves 64 and 65 are dramatically affected by the RFI, which causes a dip in both plots near x=17, indicating significant noise. In contrast, the top curve 60, which uses an update comprising errNP, does not show a decrease in SNR. Rather, the SNR for curve 60 remains relatively constant. Thus, the FEQ update comprising errNP mitigated the effect of the RFI.

The closest tones to the RFI (66A and 66B) are of course the most affected, as shown by the dip in the SNR plots 64 and 65. Since the interference on those tones are higher that the required dmin1 (i.e., the minimum distance between points of the constellation), the decisions and the errors on those tones may be wrong, making it impossible to mitigate the RFI when using a slicer. The training should be done with the ideal references.

Example 2

Figure 7:
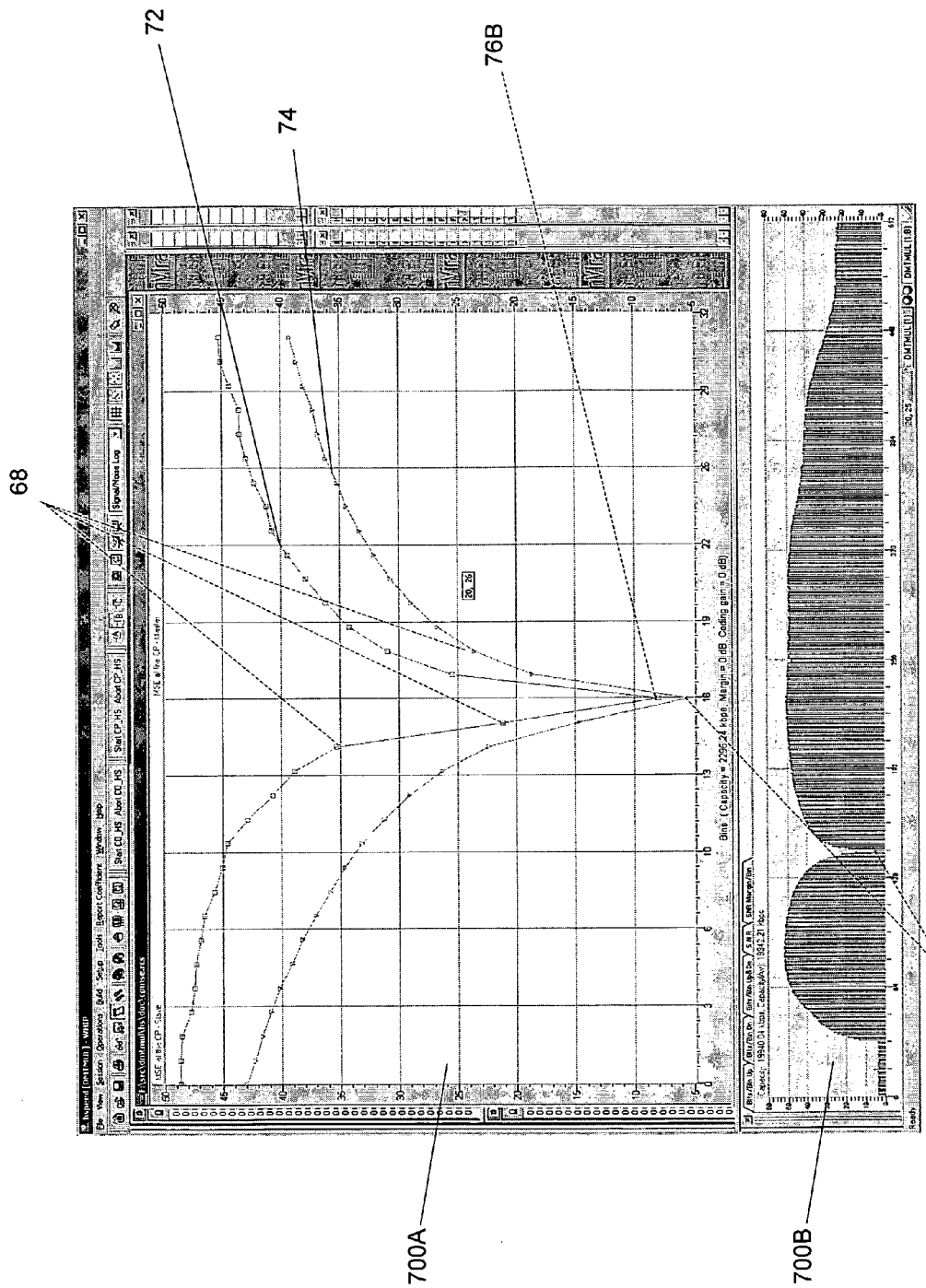
FIG. 7 depicts a signal-to-noise ratio during a medley of an FM tone signal using default equations according to a traditional method of canceling noise.
Figure 8:
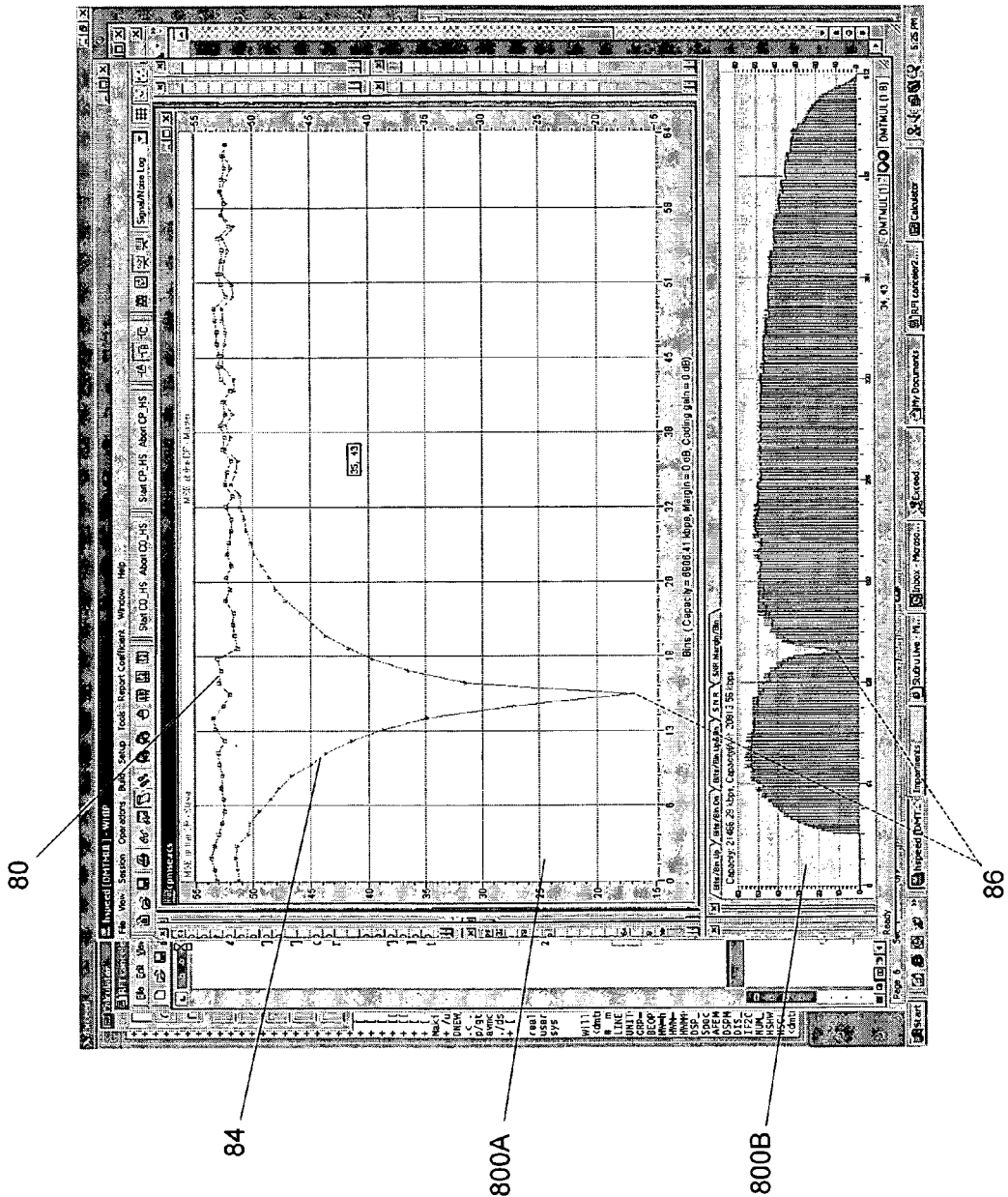
FIG. 8 depicts a signal-to-noise ratio during a medley of an FM tone signal with modified equations according to an embodiment of the invention.

In the example corresponding to FIGS. 7 and 8, an RFI tone was injected into a signal through a DDS function generator. Here, the RFI tone was defined as an FM tone with $f_c$=620 kHz (around tone 144) and Amp=90 $mV_{pp}$. The received signal is more or less 200 mVpp, which sets the RFI power level at 6 dB lower than the received signal.

FIG. 7 is a depiction of a signal-to-noise ratio during a medley of an FM tone with default equations. In FIG. 7, top graph 700A shows SNR plots 72 and 74, each comprising points corresponding to the SNR of individual tones 68 from a signal. Bottom graph 700B shows an expanded bar chart view of the curve partially depicted in 74. Top graph 700A depicts an SNR plot 72 during an R-Medley using the default equation (Equation 2). SNR plot 74 shows the SNR of the FEQ (only) for all the bins. SNR plot 74 shows the SNR with the FEQ only, while SNR plot 72 with both FEQ and regular NP for tones 128 to 160. The effect of the RFI can be seen in the dip in both curves at tones 76A and 76B, which show the greatest noise.

FIG. 8 is a depiction of a signal-to-noise ratio during a medley of an FM one with modified equations. FIG. 8 depicts an SNR plot from the same FM tone but with the modified equations (Equation 4) corresponding to the use of errNP to update the FEQ. Here, curve 84 does not use errNP to update the FEQ, while curve 80 does. Thus, the noise from the RFI can be seen in curve 84 as it dips near tone 86, while the SNR for plot 80 remains relatively constant throughout.

The graph in 800B shows an expanded view of the SNR plot 84 which has the dip near tone 86 as a result of the RFI.

Figure 9:
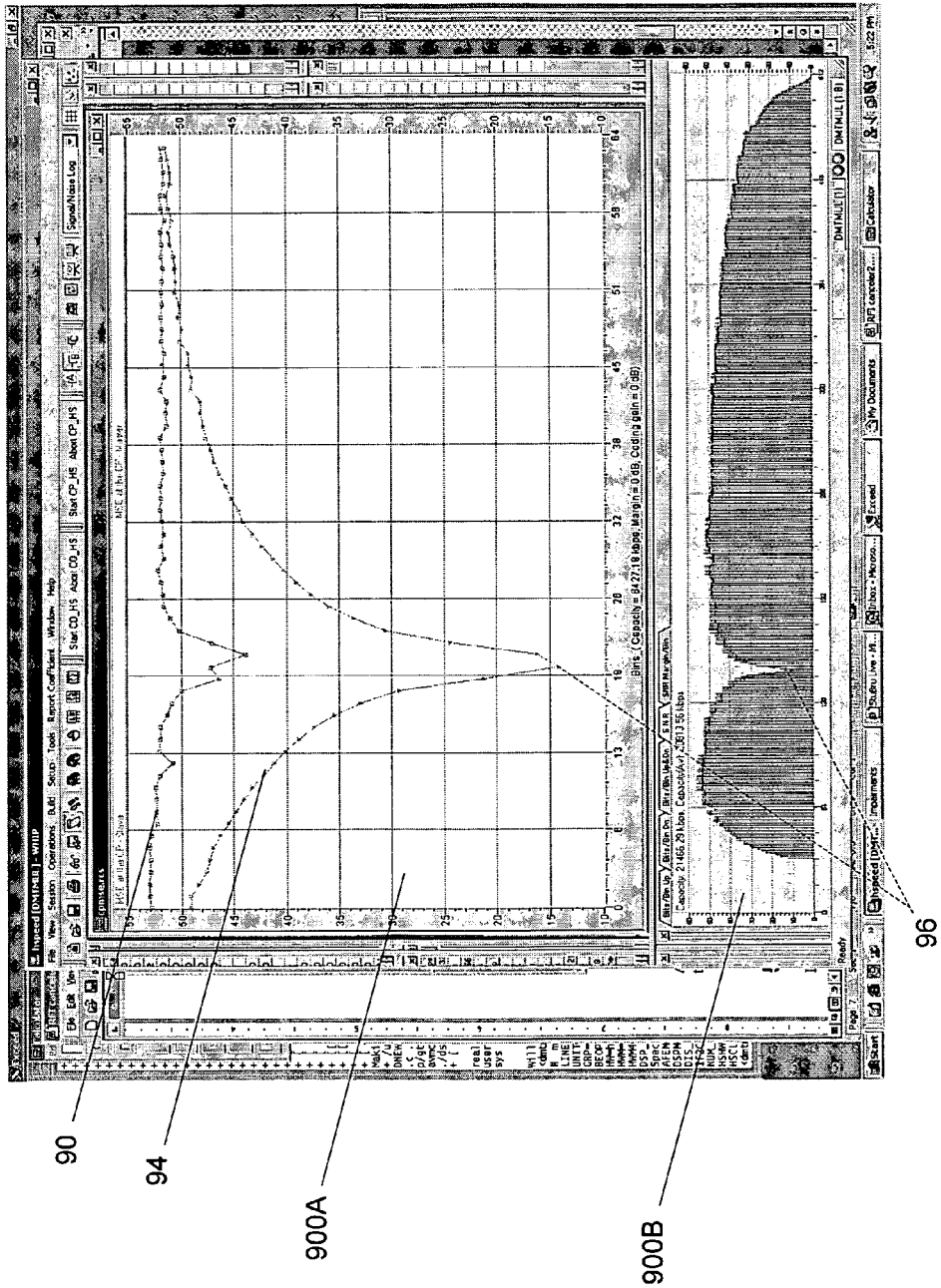
FIG. 9 depicts a signal-to-noise ratio during a medley of an AM tone signal with modified equations according to an embodiment of the invention.

FIG. 9 depicts the SNR of a signal comprising an RFI tone injected through a DDS function generator. The RFI is defined as an AM tone with $f_c$=640 kHz (around tone 148), Shape=Sine, Lev=100%, Fm=4 kHz, and Amp=300 $mV_{pp}$. SNR plot 90 shows the plot using errNP. Plot 94 does not use errNP to correct the FEQ and accordingly exhibits the additional noise near tone 96 corresponding to the RFI.

The embodiments of the present inventions are not to be limited in scope by the specific embodiments described herein. For example, although many of the embodiments disclosed herein have been described with reference to transceivers, the principles herein are equally applicable to other devices. Indeed, various modifications of the embodiments of the present inventions, in addition to those described herein, will be apparent to those of ordinary skill in the art from the foregoing description and accompanying drawings. Thus, such modifications are intended to fall within the scope of the following appended claims. Further, although the embodiments of the present inventions have been described herein in the context of a particular implementation in a particular environment for a particular purpose, those of ordinary skill in the art will recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein.

The invention claimed is:

1. A method for canceling noise in a received signal, comprising:
   receiving a signal corresponding to a current symbol at a receiver;
   equalizing the received signal using a frequency domain equalizer (FEQ);
   predicting a noise value for a subsequent symbol using the equalized signal;
   receiving a signal corresponding to a symbol subsequent in time to the current symbol at the receiver;
   determining a noise prediction error by subtracting the predicted noise value from the signal corresponding to the subsequent symbol; and
   updating the FEQ with the noise prediction error,
   wherein updating mitigates an effect of noise in the received signal, and
   wherein predicting the noise value includes:
      determining an error between the equalized signal and a data slicer output based on the equalized signal;
      delaying the error for a time corresponding to a time difference between the current symbol and the subsequent symbol; and
      generating the noise value using a noise prediction error determined for the current symbol and the delayed error, and
   wherein generating the noise value includes determining a value $NP_{k+1}$ for subsequent symbol k+1 according to:

$$NP_{k+1} = NP_k - \mu_{NP} \cdot errNP_k \cdot errFEQ_{k-1}^*$$

wherein $\mu_{NP}$ is a constant and wherein $errNP_k$ is the noise prediction error determined for the current symbol, $errFEQ_{k-1}^*$ is a complex conjugate of the delayed error and • denotes complex multiplication.

2. The method of claim 1, wherein the noise in the received signal is caused by one or more radio frequency interferers (RFIs).

3. The system of claim 1, wherein the received signal is a discrete multi-tone signal.

4. The system of claim 1, wherein the received signal is a discrete multi-tone signal, and wherein the FEQ is updated with a noise prediction error for each tone.

5. The method of claim 1, wherein the FEQ is a complex single-tap FEQ,

6. The method of claim 1, further comprising:
   training the receiver to determine the noise prediction error.

7. The method of claim 1, wherein the receiver received the signal over at least one of the following communication media:

Very High-speed Digital Subscriber Line (VDSL), Asymmetric Digital Subscriber Line (ADSL), ADSL-plus, High Bit Rate DSL, Moderate Speed DSL, Rate Adaptive DSL, Symmetric DSL, and Very High Data Rate DSL.

8. The method of claim 1, wherein the FEQ is updated with the noise prediction error and not with error of the FEQ.

9. The method of claim 1, wherein the noise comprises at least one of an AM transmission and an FM transmission.

10. A system for canceling noise in a received signal, comprising:
   a receiver configured to receive a signal corresponding to a current symbol and for receiving a signal corresponding to a symbol subsequent in time to the current symbol;
   a frequency domain equalizer (FEQ) configured to equalize the received signal corresponding to the current symbol;
   a processor configured to predict a noise value for the subsequent symbol using the equalized signal corresponding to the current symbol and configured to determine a noise prediction error by subtracting the predicted noise value from the signal corresponding to the subsequent symbol; and
   a signal combiner configured to update the FEQ with the noise prediction error,
   wherein the update of the FEQ mitigates an effect of noise in the received signal, and
   wherein the processor is configured to predict the noise value comprises:
   determine an error between the equalized signal and a data slicer output based on the equalized signal;
   delay the error for a time corresponding to a time difference between the current symbol and the subsequent symbol; and
   qenerate the noise value using a noise prediction error determined for the current symbol and the delayed error, and
   wherein the generation of the noise value includes determine a value $NP_{k+1}$ subsequent symbol k+1 according to:

$$NP_{k+1}=NP_k-\mu_{NP}\cdot errNP_k\cdot errFEQ_{k-1}^*$$

wherein $\mu_{NP}$ is a constant and wherein $errNP_k$ is the noise prediction error determined for the current symbol, $errFEQ_{k-1}^*$ is a complex conjugate of the delayed error and • denotes complex multiplication.

11. The system of claim 10, wherein the processor is configured to determine the noise prediction error based on a data slicer output and a FEQ output.

12. The system of claim 10, wherein the noise in the received signal is caused by one or more radio frequency interferers (RFIs).

13. The system of claim 10, wherein the received signal is a discrete multi-tone signal.

14. The system of claim 10, wherein the received signal is a discrete multi-tone signal, and wherein the FEQ is updated with a noise prediction error for each tone.

15. The system of claim 10, wherein the FEQ is a complex single-tap FEQ.

16. The system of claim 10, further comprising:
   training the receiver to determine the noise prediction error.

17. The system of claim 10, wherein the receiver received the signal over at least one of the following communication media: Very High-speed Digital Subscriber Line (VDSL), Asymmetric Digital Subscriber Line (ADSL), ADSL-plus, High Bit Rate DSL, Moderate Speed DSL, Rate Adaptive DSL, Symmetric DSL, and Very High Data Rate DSL.

18. The system of claim 10, wherein the FEQ is updated with the noise prediction error and not with error of the FEQ.

19. The system of claim 10, wherein the noise comprises at least one of an AM transmission and an FM transmission.

20. A system for canceling noise in a received signal, comprising:
   means for receiving a signal corresponding to a current symbol;
   means for performing frequency domain equalization on the received signal to equalize the signal;
   means for predicting a noise value for a subsequent symbol using the equalized signal;
   means for receiving a signal corresponding to a symbol subsequent in time to the current symbol at the receiver;
   means for determining a noise prediction error by subtracting the predicted noise value from the signal corresponding to the subsequent symbol; and
   means for updating the means for performing frequency domain equalization with the noise prediction error, wherein updating mitigates an effect of noise in the received signal, and
   wherein the means for predicting the noise value includes:
   means for determining an error between the equalized signal and a data slicer output based on the equalized signal;
   means for delaying the error for a time corresponding to a time difference between the current symbol and the subsequent symbol; and
   means for generating the noise value using a noise prediction error determined for the current symbol and the delayed error, and
   wherein the means for generating the noise value includes means for determining a value $NP_{k+1}$ for subsequent symbol k+1 according to:

$$NP_{k+1}=NP_k-\mu_{NP}\cdot errNP_k\cdot errFEQ_{k-1}^*$$

wherein $\mu_{NP}$ is a constant and wherein $errNP_k$ is the noise prediction error determined for the current symbol, $errFEQ_{k-1}^*$ is a complex conjugate of the delayed error and • denotes complex multiplication.

* * * * *

UNITED STATES PATENT AND TRADEMARK OFFICE
CERTIFICATE OF CORRECTION

| | | |
|---|---|---|
| PATENT NO. | : 8,958,468 B2 | Page 1 of 1 |
| APPLICATION NO. | : 10/952435 | |
| DATED | : February 17, 2015 | |
| INVENTOR(S) | : Servaes | |

It is certified that error appears in the above-identified patent and that said Letters Patent is hereby corrected as shown below:

In the specification

In Column 2, Line 66, delete "FFout" and insert -- FFTout --, therefor.

In Column 4, Line 9, delete "•is" and insert -- • is --, therefor.

In Column 4, Line 10, delete "trough" and insert -- through --, therefor.

In Column 4, Line 31, delete "512coefficients" and insert -- 512 coefficients --, therefor.

In Column 5, Line 19, delete "that" and insert -- than --, therefor.

In Column 5, Line 32, delete "less200 mVpp," and insert -- less 200 mVpp, --, therefor.

In Column 5, Line 48, delete "FM one" and insert -- FM tone --, therefor.

In the claims

In Column 6, Line 55, in Claim 3, delete "system" and insert -- method --, therefor.

In Column 6, Line 57, in Claim 4, delete "system" and insert -- method --, therefor.

In Column 6, Line 61, in Claim 5, delete "FEQ," and insert -- FEQ. --, therefor.

In Column 7, Line 35, in Claim 10, delete "qenerate" and insert -- generate --, therefor.

Signed and Sealed this
Third Day of November, 2015

Michelle K. Lee
*Director of the United States Patent and Trademark Office*